United States Patent [19]
Martin

[11] Patent Number: 5,179,358
[45] Date of Patent: Jan. 12, 1993

[54] CIRCUIT, COUNTER AND FREQUENCY SYNTHESIZER WITH ADJUSTABLE BIAS CURRENT

[75] Inventor: Frederick L. Martin, Gainsville, Fla.

[73] Assignee: Motorola, Inc., Schaumburg, Ill.

[21] Appl. No.: 845,573

[22] Filed: Mar. 4, 1992

[51] Int. Cl.[5] .................... H03L 7/18; H03K 21/00
[52] U.S. Cl. ................................. 331/1 A; 331/8;
331/25; 331/186; 307/296.3; 307/296.5;
307/296.7; 323/350
[58] Field of Search ............... 331/1 A, 8, 15, 25,
331/186; 307/296.1, 296.3, 296.4, 296.5, 296.7;
323/349, 350, 351

[56] References Cited
U.S. PATENT DOCUMENTS 3,958,135  5/1976  Rosenthal .................. 307/296.7
4,999,519  3/1991  Kitsukawa et al. ........ 307/296.3

OTHER PUBLICATIONS

IEEE Journal of "Solid State Circuits", Oct. 1990, vol. 25, No. 5, pp. No. 1136-1140.

Primary Examiner—Siegfried H. Grimm
Attorney, Agent, or Firm—Pedro P. Hernandez

[57] ABSTRACT

An electronic circuit (100) includes a load stage circuit (116) having at least one FET (118 and 120). The load stage circuit (116) includes an adjustment terminal responsive to an adjustment voltage for controlling the load resistance of the FET (118 and 120). The electronic circuit (100) also includes a bias current generator (124) for generating a bias current. A current steering circuit (122) controls the amount of bias current supplied to the load stage circuit (116). The electronic circuit (100) also includes a plurality of output terminals (112 and 114) for providing an output which is responsive to voltages applied at input terminals (104, 106 and 108) of the current steering circuit (122). Circuit (100) alllows for the adjustment of the bias current to the circuit in order to achieve optimum power dissipation over changing operating conditions.

19 Claims, 3 Drawing Sheets

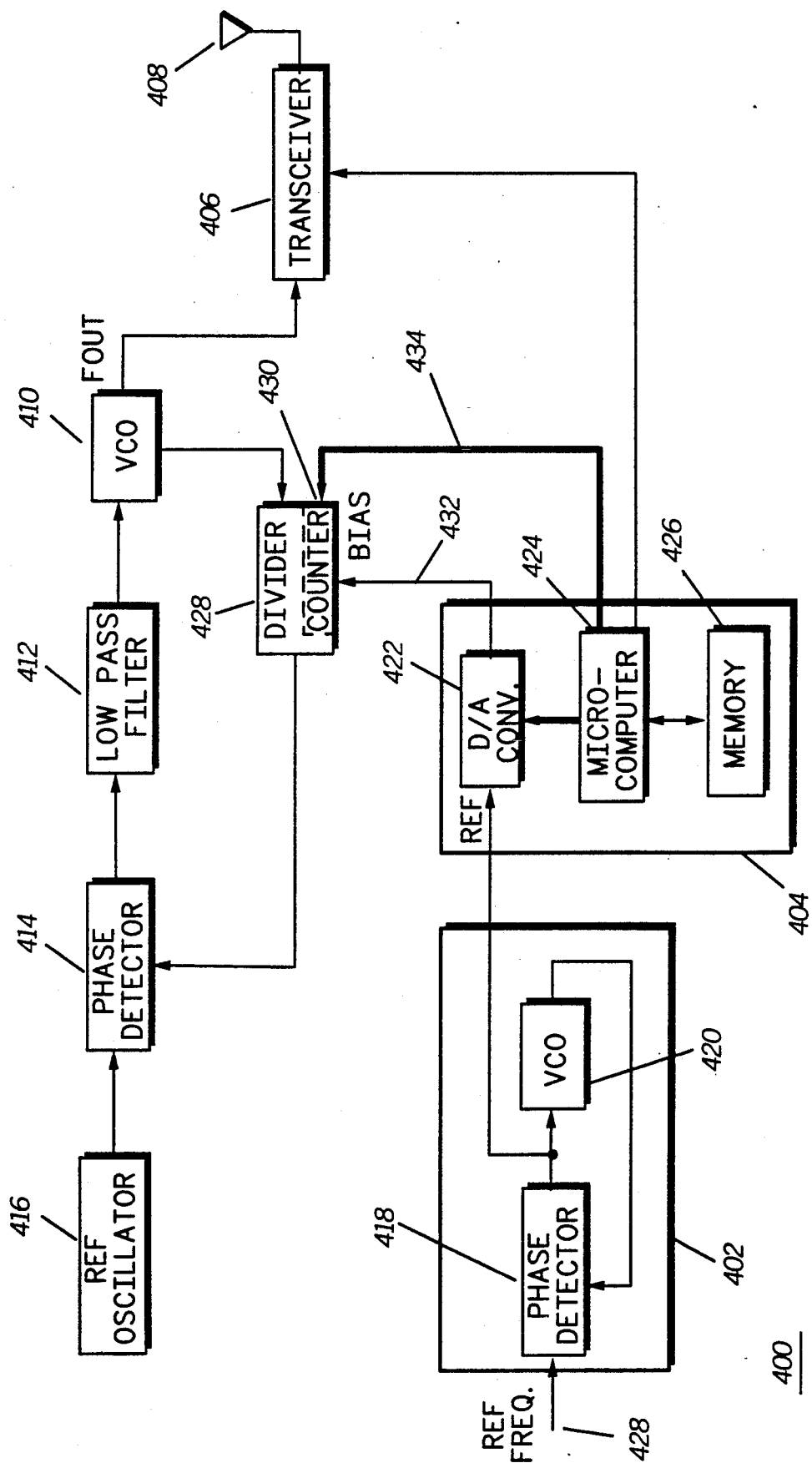

CIRCUIT, COUNTER AND FREQUENCY SYNTHESIZER WITH ADJUSTABLE BIAS CURRENT

TECHNICAL FIELD

This invention relates generally to electronic circuits, and more specifically to a circuit having adjustable bias current.

BACKGROUND

In existing emitter-coupled logic circuits, circuit loads are implemented with either fixed value resistors or multiple forward-biased diodes. Neither of these techniques are ideal for low supply voltage (e.g., less than 5 volts) circuits, which must operate over a wide range of input frequencies. Bias current and, therefore, operating speed in circuits employing fixed resistor loads can be adjusted only over a narrow range. In circuits with diode loads, the bias current can be adjusted. However, associated with the diode is a large voltage drop (about 0.8 volt per diode) which limits the utility of a diode-load circuit in low voltage systems. A need thus exists for a circuit which can overcome these problems, facilitating the design of low voltage circuits having minimum power dissipation.

SUMMARY OF THE INVENTION

Briefly, according to the invention, an electronic circuit having adjustable bias current comprises a load stage comprising a field-effect transistor. The load stage includes an adjustment terminal responsive to an adjustment voltage for controlling the load resistance of the field-effect transistor. The electronic circuit also includes a bias current generator means for generating the bias current supplied to the electronic circuit. Finally, the electronic circuit includes a current steering means for controlling the amount of bias current supplied to the load stage.

BRIEF DESCRIPTION OF THE DRAWINGS

FIG. 4 is a schematic of a radio in accordance with the invention.

DETAILED DESCRIPTION OF THE PREFERRED EMBODIMENT

Figure 1:
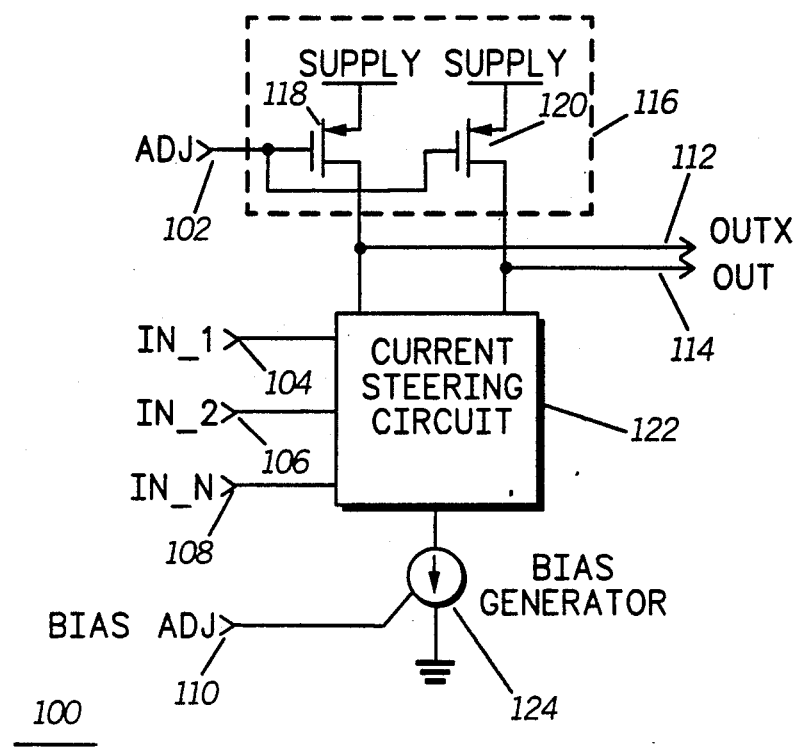
FIG. 1 is a block diagram of a circuit in accordance with the invention.

Referring now to the drawings and specifically to FIG. 1, there is shown a block diagram of a circuit with adjustable bias current 100 in accordance with the invention. Circuit 100 consists of an adjustable bias current generator 124, a load stage such as a pair load structure 116 and a current steering means such as current steering circuit 122. Current steering circuit 122 is used for steering substantially all of the bias current generated by bias current generator 124 to one or the other of the load structures 118 or 120 which comprise load stage 116. The steering of the bias current is done in response to inputs 104, 106 and 108 of current steering circuit 122 and according to some logic rules established by the implementation of current steering circuit 122 (e.g., in a logic circuit implementation such as a NAND circuit, current steering circuit 122 will follow the logic rules for NAND logic circuits). The load structures 118 and 120 are preferably implemented with field-effect transistors (FET) operating in the triode region. The resistance of the FETs is a function of the voltage applied to the gates of the devices at adjustment (ADJ) terminal 102.

In the preferred embodiment inputs 104, 106 and 108 to current steering circuit 122 are binary, with logic state definitions related to physical input properties. For example, the circuit implemented may be a NAND logic circuit having predefined output values relating to the input values present. The output terminal of the circuit may be either differential or single-ended. Circuit 100 is shown with two output terminals, first output terminal 114 (OUT) and second output terminal 112 (OUTX). In operation, circuit 100 produces a binary output at output terminals 112 and 114 in response to one or more binary inputs according to the logic rule (NAND, NOR, etc.) defined by the structure of the steering circuit 122. The amount of bias current applied to the circuit 100 is controlled by the voltage level which is applied at bias adjustment terminal 110. Thus, load resistance and the bias current may each be adjusted for circuit 100.

The utility of the invention is most easily demonstrated through an example. The structure to be used in the example is a two-terminal differential input, differential output NAND gate circuit 200, shown in FIG. 2. In operation, the differential output, measured between first and second output terminals 216 and 214 (OUT and OUTX), is manipulated as a function of differential inputs measured between first set of input terminals 204 and 206 (A and AX) and between the second set of input terminals 208 and 210 (B and BX). For each pair of logic terminals (208 and 210, and 204 and 206), a voltage on the positive terminal (A, B, OUT) higher than the voltage on the negative terminal AX, BX, OUTX) represents a "high" logic level (logic ONE). A differential voltage of less than zero between positive and negative terminals represents a "low" logic level (logic ZERO). In a typical design, some minimum allowed differential voltage magnitude $\Delta V$ between terminals is selected and designed for in circuit 200 to insure adequate noise immunity for the circuit.

The structure of the NAND gate matches the generalized diagram of FIG. 1. The current steering stage consists of bipolar transistors 222, 224, 226 and 228 arranged to produce the NAND logic function. The adjustable bias generator is realized through transistor 230. The value of the bias current supplied through the collector of transistor 230 is adjusted by manipulation of the voltage level applied to the base of transistor 230 at bias adjustment terminal 212 (BIAS). The load stage of the structure is comprised of p-channel FET devices 218 and 220 which have their gate terminals connected to adjustment terminal 202 (ADJ). The amount of load resistance presented by each of the FETs 218 and 220 is determined by the voltage level applied to adjustment terminal 202. FETs 218 and 220 are operated in the triode region, where drain-to-source resistance is a linear function of the gate voltage less threshold voltage.

Figure 2:
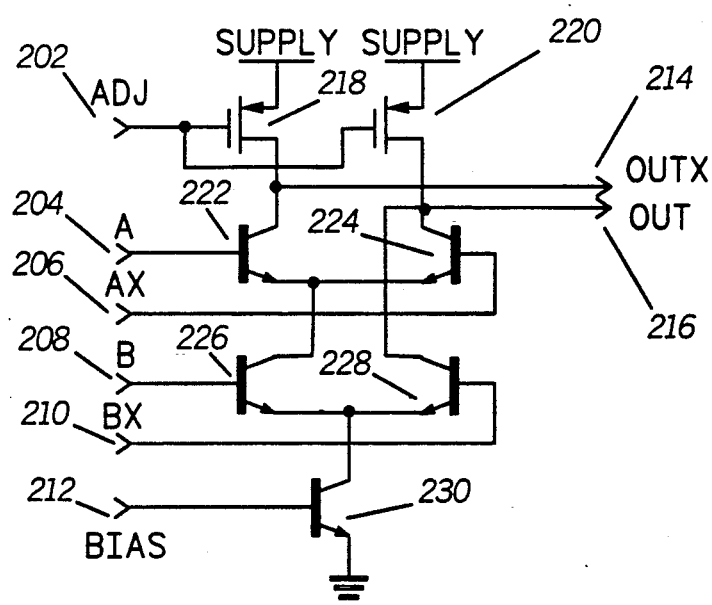
FIG. 2 is a schematic of a NAND implementation of the present invention.

Although shown as a NAND gate in FIG. 2 the present invention can be utilized in many other types of circuits. Other such circuits can include other ECL logic circuits such as NOR, AND, OR, and EXCLU- SIVE-OR configurations (the logic configurations are determined by how the current steering circuit 122 is implemented) and other high-speed, low-voltage circuits. More complex logic circuits having a more complex logic relationship (than the standard logic circuits mentioned above) between the circuit's input and output terminals can be easily designed using conventional IC logic design techniques when designing the current steering portion of the invention. The number of load FETs (such as FETs 118 and 120) utilized in the circuit will depend on the type of logic circuit designed and the complexity of current steering circuit 122.

The present invention is well suited for low-power applications, where it is advantageous to bias the ECL circuit with the minimum current which facilitates correct operation as a logic circuit. For a constant minimum differential voltage $\Delta V$, operating speed of any ECL structure is a function of bias current and load resistance. The amount of bias current required is determined by the amount of bias current required to produce the minimum differential voltage $\Delta V$ across the circuit loads (in this case FETs 218 and 220). For typical device structures, speed of operation is limited by the RC time constant formed by the resistance of the load devices and parasitic capacitances at the output terminals. Higher values for load resistance facilitate lower bias current but limit speed of operation, due to the time constants at the output terminals.

Lower load resistance values, while facilitating reduced output terminal time constants and increased operating speeds, require relatively more bias current to insure that $\Delta V$ is maintained at the output terminals. Thus, speed of operation can be made adjustable only if both the load resistance and the bias current of the ECL structure can be adjusted. It can be seen that this dual adjustment is achievable in the invention of FIG. 2 (ADJ terminal 202 and BIAS terminal 212). If the load devices (FETs 218 and 220) in the figure were replaced with fixed resistors (resistor-load ECL, RLECL) as is the case with previously designed ECL circuits, the dual adjustment of load resistance and bias would not be possible. Thereby, optimization of the circuit's power dissipation could not be achieved.

Diode-load ECL (DLECL) circuits are used widely in synthesizer applications. The advantage of the present invention over conventional DLECL structures is that of being able to operate under lower supply voltage conditions. The voltage drop across each diode is about 0.8 volts. A typical DLECL gate uses a load of two diodes in series, resulting in a voltage drop across the load of approximately 1.6 volts. Using the FET loads of the present invention, the voltage drop across the load is limited to $\Delta V$. For a typical value of $\Delta V$ of 0.1 volt, the ECL structure of the invention can operate with a supply voltage 1.5 volts less than a similar DLECL structure. Therefor, by using the present invention, circuits can operate at lower supply voltage than current DLECL circuits.

Because separate manipulation of analog voltages applied to the ADJ terminal 202 and BIAS terminal 212 is difficult, a typical implementation of the circuit of FIG. 2 would preferably include some means for automatically generating the voltage at the BIAS terminal 212 as a function of the voltage at the ADJ terminal 202. One method of achieving this is by using a self-biased Widlar current source as shown in FIG. 3, in combination with circuit 200.

Figure 3:
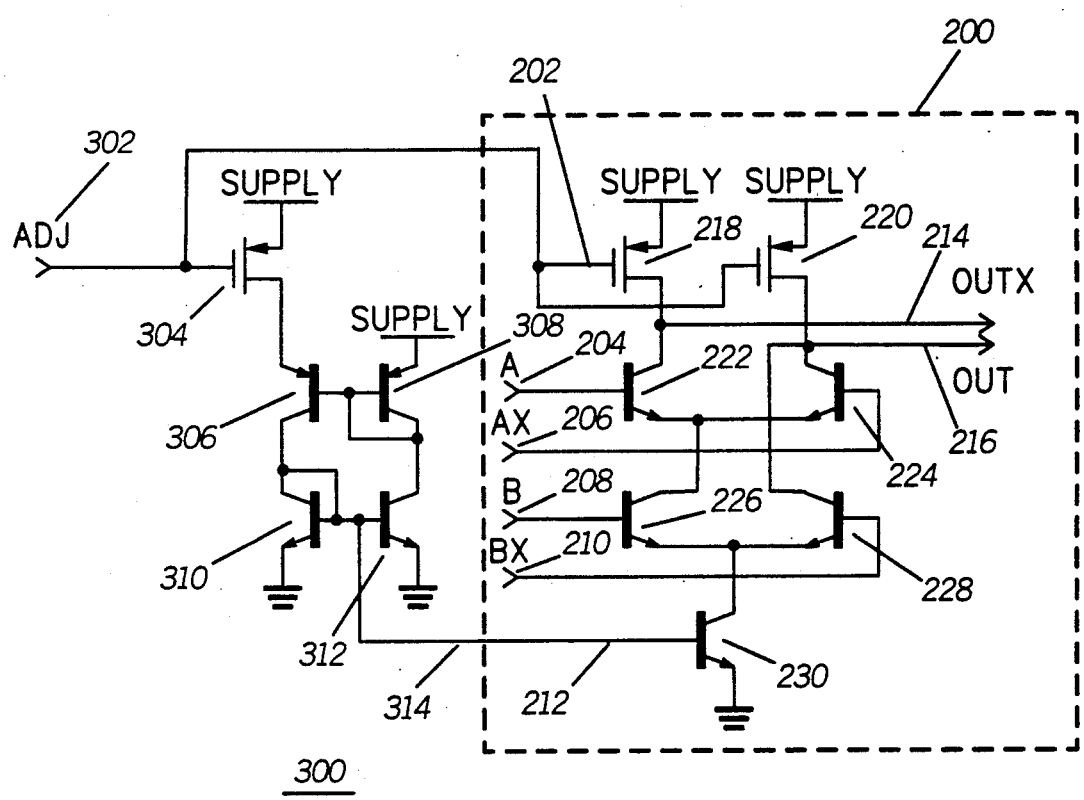
FIG. 3 is a schematic of the NAND circuit of FIG. 2 with a self-biased current source for controlling the BIAS and ADJ terminals of the NAND circuit in accordance with the present invention.

In FIG. 3, the current setting element is a p-channel FET 304. The voltage across FET 304 is determined by the ratio of emitter areas of PNP transistors 306 and 308 when the transistors are designed into an integrated circuit. NPN transistors 310 and 312 which are preferably matched (having the same areas when designed), act as a current mirror to self-bias current source transistor 230. In addition, the base terminals of transistors 310 and 312 which are coupled together, provide the output terminal 314 for the bias voltage which is connected to the base 212 of transistor 230.

The adjustment (ADJ) terminals 302 and 202 of the two circuits are connected, insuring that the current source (transistor 230) and the logic gate load resistance of the FETs (118 and 120) track. The output terminal 314 of the self-biased Widlar circuit is connected to the bias current adjustment (BIAS) terminal 212 creating a current mirror with the current in transistor 230 in the logic circuit acting to mirror the current of transistor 310 in the current source.

When designing the IC if matching and interconnect criteria are met, the result is a logic circuit having bias current as a function of the voltage applied to adjustment terminal (ADJ) 302, and a differential voltage output magnitude which is dependent only on the scaling ratio of current source transistors 306 and 308, where the scaling ratio signifies that the IC areas for the different components are not equal (design areas do not have a ratio of 1:1).

In the circuit of FIG. 3 the emitter area of transistor 312 is preferably made half the size of the emitter of transistor 230 when the IC is designed in order to minimize the current consumption of the Widlar circuit in relation to circuit 200. In the same way, when FETs 218 and 220 are designed into the IC, the FETs are scaled in order to provide the desired voltage at outputs 214 and 216. FET 304 is also scaled differently from FETs 218 and 220 since the current across the two circuits is different (to minimize the current consumption of the Widlar circuit in relation to circuit 200). Also, the voltage across the drain to source terminal of FET 304 is dictated by the ratio of areas of transistors 306 and 308 when they are designed. While the voltage across FETs 218 and 220 is set as a function of the design parameters for logic circuit 200.

The implementation of FIG. 3 is one of many which could be used to achieve the same result (controlling adjustment terminal 202 and bias current adjustment terminal 212 using a single control voltage). Other possibilities include modified versions of the Widlar current source and $V_{be}$-based current sources for controlling the ADJ and BIAS terminals 202 and 212 of circuit 200.

The present invention is an improved configuration for an emitter-coupled logic (ECL) digital circuit. The intended application of the circuit is preferably in building blocks for high-speed frequency counters and other high speed circuits. Such high-speed circuits can be used in frequency synthesizers for land-mobile and cellular radios, and for other electronic devices which require the ability to work at lower voltages with minimum power dissipation. The circuit of FIG. 3 could be used as part of a counter or other logic network which automatically self-adjusts to the minimum bias current which enables correct operation. In this manner, adjustments to bias current would be made for variations in environment, IC processing and operating speed, etc. such that the bias current would be optimized, thus providing for optimum power dissipation which in most cases is minimum power dissipation.

One application for circuit 300 is in the high-speed counters found in the divider circuits of frequency synthesizers in land-mobile and cellular radios. Typically, this counter is implemented using ECL structures, either in a separate "prescaler" integrated circuit, or integrated on the same substrate as other elements of the synthesizer. In either case, the high speed divider is a dominant contributor to total synthesizer power dissipation, making minimizing of counter bias current desirable.

The adjustment voltage into ADJ terminal 302 can come from any circuit which can provide a voltage which is proportional to the operating conditions in which circuit 300 is a part of. For example, a microprocessor can provide the adjustment voltage to ADJ terminal 302 where the voltage applied by it is proportional to operating characteristics of circuit 300 (changes in operating voltage, temperature, etc.). One example of an implementation of circuit 300 will be discussed below.

In FIG. 4, a communication device such as a radio 400 utilizing the present invention is shown. The radio 400 comprises a conventional radio frequency (RF) transceiver 406 which includes appropriate receiver and transmitter circuits. An antenna 408 is coupled to the transceiver 406 for use in transmitting and receiving RF signals. Transceiver 406 is also coupled to a phase-lock-loop (PLL) synthesizer section which includes the present invention.

The synthesizer comprises a reference oscillator 416 which produces a reference frequency signal. The reference signal is in turn applied to the first input of phase detector 414. The phase detector 414 has a second input coming from the loop divisor circuit or divider 428. In order to generate one of a number of desired synthesized frequencies, the synthesized frequency FOUT is scaled by a divisor N from divider circuit 428. The divisor N is chosen to correspond to the desired synthesized frequency. Coupled to phase detector 414 is low pass loop filter 412 which is in turn coupled to the input of voltage controlled oscillator (VCO) 410 in order to provide a control voltage to the VCO 410. The output signal of the VCO 410 is in turn coupled to transceiver 406.

A component of synthesizer 400 which tends to dissipate a great amount of power is the high speed counter 430 which is part of divider circuit 428. Those skilled in the art will realize that divider 428 can consist of a high-speed counter alone, or as in the particular case of the preferred embodiment be one of the components comprising divider 428. Conventional high speed counters are usually constructed on a single integrated circuit from constant bias (either resistor-load or diode-load) logic gate structures which operate with a fixed supply voltage. The logic gates are constructed in such a manner that propagation delay is a function of bias current. Bias current in conventional synthesizers is fixed for a given application as a trade-off between power dissipation and gate propagation delay. Higher counter input frequencies require higher bias current. To insure proper operation under all conditions, the nominal bias current is set sufficiently high to account for variation in supply voltage, device characteristics, temperature and operating frequency. Therefore, nominal bias current is often as much as fifty percent higher than required, for a given set of operating conditions.

By utilizing the logic circuit of the present invention in the logic circuits forming high-speed counter 430, lower bias current is achieved. The circuit also eliminates the need to set the logic circuit bias current above optimum levels as done in previous circuits, thereby allowing for lower power dissipation in counter 430 in all but worst case conditions.

Included as part of radio 400 in order to determine the propagation delay of counter 430 is a delay estimator means such as delay estimator circuit 402, and a delay processor means such as delay processor circuit 404. In operation, the propagation delay estimator circuit 402 produces an output signal (REF) having a value proportional to the estimated propagation delay of counter 430 inside of divider circuit 428.

The invention could be applied in this environment either as part of a bias setting mechanism for a fixed-biased prescaler, or as part of a self-adjusting bias mechanism. As a bias setting mechanism, the invention would allow the development of a single low voltage prescaler IC or synthesizer IC for which power dissipation could be minimized as a function of the synthesizer operating band (i.e. UHF, VHF 800). In a self-adjusting scheme, the invention could be used in a synthesizer which would dynamically adjust counter circuit bias current as a function of environmental conditions and operating frequency to minimize power dissipation.

In FIG. 4, the delay estimator means 402 comprises a phase detector 418 which receives a reference frequency 428 preferably from reference oscillator 416 (or another oscillator in radio 400) and a VCO 420 which is coupled to phase detector 418. The delay processor means 404 comprises a controller means such as microcomputer 424 which is coupled to memory 426 and to a digital to analog (D/A) converter 422. Controller means 424 also preferably controls the operation of transceiver 406 as well divider 428.

The reference signal (REF) from the delay estimator circuit 402 is provided to D/A converter 422. Also, digital inputs are provided in the form of digital words by controller means 424 to D/A converter 422. Controller means 424 also controls the frequency the divider circuit 428 is operating at by way of data bus 434. Control signals are sent from controller means 424 to divider 428 in order to control the frequency of divider 428.

In the preferred embodiment, the digital word supplied to the D/A 422 by microcomputer 424 is proportional to the input frequency to counter 430. If the bias adjustment (BIAS) voltage 432 as a function of input frequency is not linear, this can be compensated for by the value of the digital word for a given frequency of operation. The bias signal (BIAS) 432 sent by the delay processor circuit 404 to counter 430 is the bias voltage which will set the minimum current in order to enable correct counter operation. The BIAS signal 432 can take into account such factors as ambient temperature, supply voltage changes, input frequency of counter 430, and other characteristics which can affect the operating conditions of counter 430. Although the delay estimator 402 does not show a low pass filter, one can be included in order to match the propagation delays of circuit 402 with divider 428 as close as possible.

D/A converter 422 can take the form of a circuit were the reference voltage signal (REF) sets the top voltage in a resistive ladder and the digital word sent by microcomputer 424 to the converter selects the tap in the resistive ladder to use. Thereby, a specific voltage is selected for the given operating conditions present. The bias voltage (BIAS) 432 thus produced is coupled to the adjustment terminal 302 (see FIG. 3) of circuit 300 which is utilized in divider 428. Those skilled in the art will appreciate that other more sophisticated approaches having more tracking precision to the operating conditions can be utilized for generating the BIAS voltage 432.

Many variations to the circuit of FIG. 4 are possible. The circuit can also be implemented using diode-load emitter-coupled logic (DLECL), since the gate loads are formed by diodes whose resistances are set dynamically by the bias current to the structure. However by utilizing the circuit discussed in FIGS. 1-3 a lower operating voltage for the divider can be achieved.

Propagation delay could also be estimated directly by measurement of phase or time shifts rather through the use of the oscillator structure of circuit 402. The propagation delay estimate could also be performed using the counter input signal as a reference, thus minimizing the need for a processing element between the propagation delay estimator 402 and counter 430. Processing could also be performed using all analog or all digital methods instead of the hybrid approach shown in FIG. 4.

The optimal bias current for the high speed counter which is part of divider circuit 428 is achieved by the following steps:

1. The propagation delay for a given bias current is estimated by measuring the delay in a circuit similar to the counter. Typically, this similar circuit is implemented on the same integrated circuit (IC) substrate as the counter using structures similar to those used in the counter;

2. The propagation delay output is applied to a processor where the estimated delay, the frequency of the counter input, and known scaling characteristics are utilized to produce an estimated optimal bias current for the counter; and 3. The optimal bias current is applied to the counter in order to minimize power dissipation.

In summary, the present invention provides for an improved circuit having both adjustable load resistance and adjustable bias current. The invention can be implemented in building blocks for high-speed frequency counters and other circuits such as in frequency synthesizers for land-mobile and cellular products. Improvement over both conventional resistor-load emitter-coupled logic (RLECL) and diode-load emitter-coupled logic (DLECL) circuits can be achieved. The invention provides for optimum bias current over changing operating conditions thereby minimizing power dissipation and maximizing the circuit's operating speed. By including a delay estimator circuit 402, which estimates the propagation delay of the circuit in which the logic circuit (similar to the FET-load ECL circuit of FIG. 3) is utilized, an adjustment voltage ADJ can be applied to the circuit which will optimize the bias current and load resistance of the circuit.

What is claimed is:

1. An electronic circuit having adjustable bias current, comprising:
 a load stage comprising a field-effect transistor, the load stage having an adjustment terminal responsive to an adjustment voltage for controlling the load resistance of the field-effect transistor;
 a bias current generator means for generating the bias current supplied to the electronic circuit; and
 a current steering means, for controlling the amount of bias current supplied to the load stage.

2. The electronic circuit having adjustable bias current of claim 1, wherein the circuit is an emitter-coupled logic (ECL) circuit.

3. The electronic circuit having adjustable bias current of claim 2, wherein the current steering means forms a logic circuit selected from the logic circuit group of NAND, NOR, AND, EXCLUSIVE-OR and OR.

4. The electronic circuit having adjustable bias current of claim 3, wherein the bias current generator is responsive to a bias current adjustment voltage for controlling the amount of bias current supplied to the electronic circuit.

5. An electronic circuit having adjustable bias current, comprising:
 a load stage having a plurality of field-effect transistors, the load stage having an adjustment terminal responsive to an adjustment voltage for controlling the load resistance of the field-effect transistors;
 a bias current generator having a bias adjustment terminal responsive to a bias current adjustment voltage for generating the bias current supplied to the electronic circuit; and
 a current steering means for controlling the amount of bias current supplied to each of the plurality of field-effect transistors.

6. The electronic circuit having adjustable bias current of claim 5, wherein the electronic circuit is an emitter-coupled logic (ECL) circuit.

7. The electronic circuit having adjustable bias current of claim 5, wherein the electronic circuit further comprises:
 a means coupled to the load stage and bias current generator for generating the bias current adjustment voltage as a function of the adjustment voltage.

8. The electronic circuit having adjustable bias current of claim 7, wherein the current steering means forms a logic circuit selected from the logic circuit group of NAND, NOR, AND, EXCLUSIVE-OR and OR.

9. A counter assembly having minimum power dissipation, comprising:
 a counter, comprising:
  an electronic circuit having adjustable bias current, including:
   a load stage comprising a load device;
   a current steering means coupled to the load stage for controlling the amount of bias current to be supplied to the load device; and
   a bias current generator coupled to the current steering means for controlling the amount of bias current supplied to the electronic circuit; and
 a delay estimator coupled to the counter for estimating the propagation delay of the counter and providing a reference output signal which has a value corresponding to the propagation delay of the counter, the bias current generator adjusts the amount of bias current supplied to the electronic circuit in response to the reference output signal.

10. The counter assembly of claim 9, wherein the electronic circuit is an emitter-coupled logic (ECL) circuit and the load device is a field effect transistor.

11. The counter assembly of claim 9, wherein the load device is a field-effect transistor (FET).

12. A synthesizer, comprising:
a reference oscillator;
a phase detector coupled to the reference oscillator; and
a divider circuit coupled to the phase detector, the divider circuit comprising an electronic circuit having adjustable bias current, comprising:
 a load stage having a field-effect transistor, the load stage having an adjustment terminal responsive to an adjustment voltage for controlling the load resistance of the field-effect transistor;
 a bias current generator having a bias adjustment terminal responsive to a bias current adjustment voltage for generating the bias current supplied to the electronic circuit; and
 a current steering means for controlling the amount of bias current supplied to the field-effect transistor.

13. The synthesizer of claim 12, wherein the electronic circuit is an emitter-coupled logic (ECL) circuit.

14. The synthesizer of claim 13, wherein the electronic circuit further comprises:
 a means coupled to the load stage and bias current generator for generating the bias current adjustment voltage as a function of the adjustment voltage.

15. A synthesizer, comprising:
a reference oscillator;
a phase detector coupled to the reference oscillator; and
a counter coupled to the phase detector, the counter comprising:
 an electronic circuit having adjustable bias current, including:
  a load stage comprising a load device;
  a current steering means coupled to the load stage for controlling the amount of bias current to be supplied to the load device; and
  a bias current generator coupled to the current steering means for controlling the amount of bias current supplied to the electronic circuit; and
 a delay estimator circuit coupled to the counter for estimating the propagation delay of the counter and providing a reference output signal which has a value corresponding to the propagation delay of the counter, the bias current generator adjusts the amount of bias current supplied to the electronic circuit in response to the reference output signal.

16. The synthesizer of claim 15, wherein the electronic circuit is an emitter-coupled logic (ECL) circuit and the load device is a field effect transistor.

17. The synthesizer of claim 15, wherein the load device is a field-effect transistor (FET).

18. A radio, comprising:
a receiver; and
an electronic circuit having adjustable bias current coupled to the receiver, comprising:
 a load stage comprising a field-effect transistor, the load stage having an adjustment terminal responsive to an adjustment voltage for controlling the load resistance of the field-effect transistor;
 a current steering means coupled to the load stage for controlling the amount of bias current to be supplied to the field-effect transistor; and
 a bias current generator means coupled to the current steering means for controlling the amount of bias current supplied to the electronic circuit.

19. The radio of claim 18, wherein the electronic circuit further comprises:
 a means coupled to the load stage and bias current generator for generating a bias current adjustment voltage as a function of the adjustment voltage.

* * * * *